United States Patent
Lin et al.

(10) Patent No.: US 7,521,305 B2
(45) Date of Patent: *Apr. 21, 2009

(54) METHOD FOR FABRICATING SEMICONDUCTOR DEVICE

(75) Inventors: Cha-Hsin Lin, Hsinchu (TW);
Zing-Way Pei, Hsinchu (TW);
Ming-Jinn Tsai, Hsinchu (TW);
Shing-Chii Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 360 days.

This patent is subject to a terminal disclaimer.

(21) Appl. No.: 11/140,952

(22) Filed: Jun. 1, 2005

(65) Prior Publication Data

US 2006/0160341 A1    Jul. 20, 2006

(30) Foreign Application Priority Data

Jan. 14, 2005   (TW) ............................... 94101227 A

(51) Int. Cl.
*H01L 21/8234* (2006.01)

(52) U.S. Cl. .................... 438/197; 438/195; 438/199; 438/289; 438/786

(58) Field of Classification Search ................ 438/197, 438/199, 213, 220, 313, 322; 257/E21.371, 257/21.387, 21.403, 21.441, 21.445, 21.448
See application file for complete search history.

(56) References Cited

U.S. PATENT DOCUMENTS 5,633,202 A      5/1997   Brigham et al.
6,573,172 B1 *   6/2003   En et al. ..................... 438/626
7,033,899 B2 *   4/2006   Lin et al. .................... 438/322
7,347,228 B2 *   3/2008   Lin et al. .................... 257/375
2004/0104405 A1* 6/2004   Huang et al. ................ 257/199
2005/0093078 A1* 5/2005   Chan et al. .................. 257/374
2005/0186722 A1* 8/2005   Cheng et al. ................ 438/199
2005/0260808 A1* 11/2005  Chen et al. .................. 438/197
2006/0024873 A1* 2/2006   Nandakumar et al. ....... 438/197
2006/0228848 A1* 10/2006  Chan et al. .................. 438/199

OTHER PUBLICATIONS

Silicon Processing for the VLSI Era, vol. 1—Process Techology, 2$^{nd}$ Edition S. Wolf and R.N. Tauber Lattice Press, ISBN 0-9616721-6-1, pp. 161-162.*

(Continued)

*Primary Examiner*—Ha Tran T Nguyen
*Assistant Examiner*—Daniel Whalen
(74) *Attorney, Agent, or Firm*—Birch, Stewart, Kolasch & Birch, LLP

(57) ABSTRACT

A method for fabricating a semiconductor device includes the steps of: providing a semiconductor device formed with a plurality of transistors; forming a first stress layer with a plurality of layers on the semiconductor device; forming a second stress layer with a plurality of layers on another surface of the semiconductor device; covering photo resist on a region of the first stress layer to cover at least one of the transistors; and performing ion implantation on the part of the semiconductor device that is not covered by the photo resist. In another embodiment, the second stress layers can be formed after the ion implantation. The method can simultaneously enhance the device performance of the PMOS and NMOS on the same wafer. It also solves the problem of procedure integration caused by the produced compressive stress and tensile stress.

18 Claims, 8 Drawing Sheets

OTHER PUBLICATIONS

"Silicon Processing for the VLSI Era, vol. 1—Process Techology", Wolf et al., ISBN 0-9616721-6-1, 2nd edition, Nov. 1, 1999, pp. 161-162.*

Shimizu et al., Local Mechanical-Stress Control (LMC): A New Technique for CMOS-Performance Enhancement. IEDM 01-433, 19.4.1-19.4.4, Dec. 2001.

* cited by examiner

METHOD FOR FABRICATING SEMICONDUCTOR DEVICE

This application claims the benefit of Taiwan Patent Application No. 94101227, filed on Jan. 14, 2005, which is hereby incorporated by reference for all purposes as if fully set forth herein.

BACKGROUND

1. Field of Invention

The invention relates to a method for fabricating a semiconductor device and, in particular, to a method for fabricating a semiconductor device that uses the technique of ion implantation to modulate the stress in the silicon nitride film in the semiconductor device.

2. Related Art

For a P-type metal oxide semiconductor field effect transistor (PMOSFET) and N-type metal oxide semiconductor field effect transistor (NMOSFET), they require different stresses to improve the carrier mobility in the channel region. In particular, the PMOSFET requires a compressive stress in the channel region, while the NMOSFET requires a tensile stress.

Since the stress value and type of a silicon nitride film deposited in one piece at a time are fixed, one could only select one of the PMOSFET and NMOSFET on a wafer to improve its performance by imposing a specific type of stress. That is, the prior art can only improve the performance of a single type of devices, but not both PMOS and NMOS FET's.

There are many solutions of using the technique of ion implantation to improve the stress in the silicon nitride layer. For example, U.S. Pat. No. 5,633,202 discloses a high tensile nitride layer. A doped oxide is first grown above the semiconductor device with silicide contacts. In particular, boron doped oxide is used for the PMOSFET and phosphorous doped oxide is used for the NMOSFET. Afterwards, a nitride layer is covered thereon, followed by the deposition of an interlayer dielectric.

A. Shimizu, K. Hachimine et al. implants Ge into the silicon nitride film to release the stress in a certain region. To improve the PMOSFET performance, a silicon nitride film with high compressive stress is deposited on the transistor as a cap layer. To avoid affecting the performance of the NMOS devices, Ge implantation on the silicon nitride film above the NMOS region of the same substrate is employed to release its stress. The opposite method is used if one wants to improve the NMOS devices.

It is important to provide a high stress film having different stress values in different regions for improving different types of devices. However, the prior art does not provide a satisfactory solution. Since CMOS FET's have both PMOS and NMOS devices at the same time, it is imperative to find a method for fabricating a semiconductor device with the desired properties.

SUMMARY OF THE INVENTION

With the foregoing problems being said, it is an objective of the invention to provide a method for fabricating a semiconductor device to solve these problems.

To achieve the above objective, the disclosed method includes the steps of: providing a semiconductor device formed with a plurality of transistors; forming a first stress layer with a plurality of layers on the semiconductor device; forming a second stress layer with a plurality of layers on another surface of the semiconductor device; covering photo resist on a region of the first stress layer to cover at least one of the transistors; and performing ion implantation on the part of the semiconductor device that is not covered by the photo resist.

Another embodiment of the disclosed method includes the steps of: providing a semiconductor device formed with a plurality of transistors; forming a first stress layer with a plurality of layers on the semiconductor device; covering photo resist on a region of the first stress layer to cover at least one of the transistors; performing ion implantation on the part of the semiconductor device that is not covered by the photo resist; and forming a second stress layer with a plurality of layers on another surface of the semiconductor device.

According to the objectives and principles of the invention, different types of stresses can be produced in the silicon nitride and silicon dioxide layers on the MOS transistor, improving the mobility of holes and electrons of PMOS and NMOS FET's. The carrier mobility improvement can further enhance the output current of devices, improving the device output performance. Therefore, the invention can simultaneously improve the performance of PMOS and NMOS devices on the same wafer. That is, the invention solves the difficult process integration problem because of the requirement of providing different stresses for PMOS and NMOS devices.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

BRIEF DESCRIPTION OF THE DRAWINGS

The above and other objects, features and advantages of the invention will be more clearly understood from the following detailed description when taken in conjunction with the accompanying drawings, in which.

DETAILED DESCRIPTION OF THE INVENTION

Figure 1A:
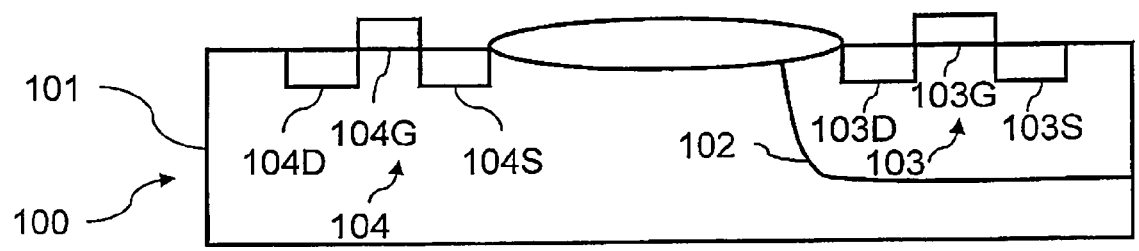
FIGS. 1A to 1F show an embodiment of the disclosed method of fabricating semiconductor devices.

Reference will now be made in greater detail to a preferred embodiment of the invention, an example of which is illustrated in the accompanying drawings. Wherever possible, the same reference numerals will be used throughout the drawings and the description to refer to the same or like parts. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

FIGS. 1A to 1D illustrate the steps of the disclosed method for fabricating a semiconductor device. The order of the steps is not fixed and not all the steps are necessary. Some steps can be performed at the same time, omitted, or included. The steps shown in this embodiment are chosen to highlight the characteristics of the invention and should not be used to limit of the order and times of steps in the invention.

First, a semiconductor device 100 is provided according to the standard CMOS process. It is formed on a semiconductor substrate 101, which is a P-type substrate doped with group-III elements. An N well 102 is formed therein. The semiconductor substrate 101 is formed with PMOS FET's 103 and NMOS FET's 104. Both the PMOSFET 103 and the NMOSFET 104 have gates 103G, 104G, sources 103S, 104S, and drains 103D, 104D, as shown in FIG. 1A.

Figure 1B:
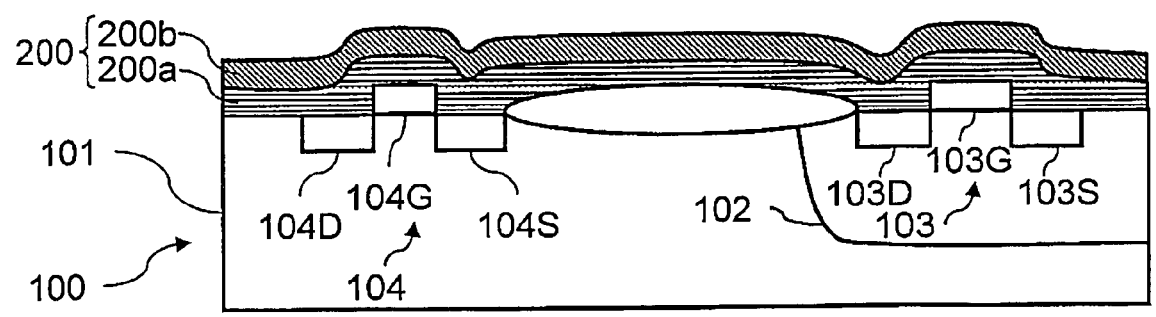

Afterwards, a first stress layer 200 is formed on the semiconductor device 100 as a cap layer for covering the PMOS FET's 103 and the NMOS FETs 104. The first stress layer 200 can have a single or many layers. The material of the first stress layer 200 is, for example, silicon nitride or the stacked layers of silicon nitride and silicon dioxide. Others such as TEOS, BPSG, PSG, BSG, $SiO_2$, and $SiO_xN_y$ may be used, too. In this embodiment of the present invention, the first stress layer 200 includes but not limited to two stacked layers of silicon nitride 200a and silicon dioxide 200b. The first stress layer 200 can be formed on the semiconductor device 100 using plasma enhanced chemical vapor deposition (PECVD) or low-pressure chemical vapor deposition (LPCVD), as shown in FIG. 1B.

Figure 1C:
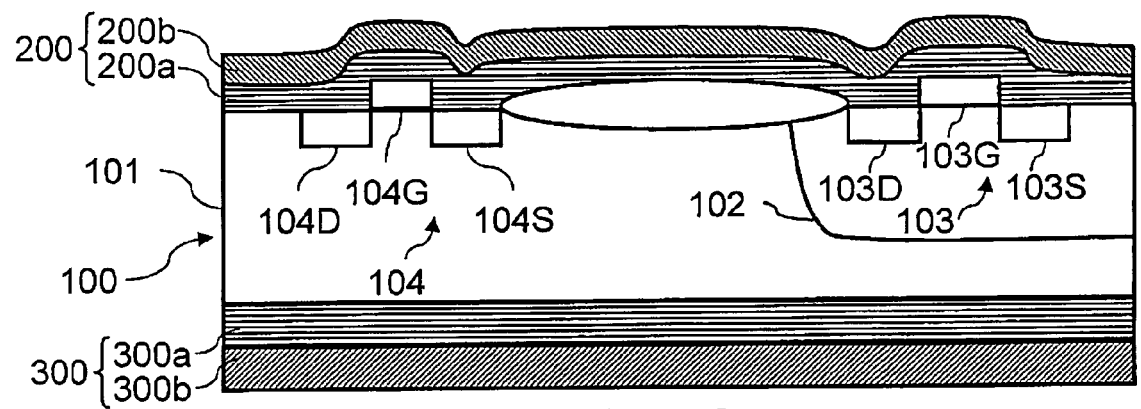
Figure 1D:
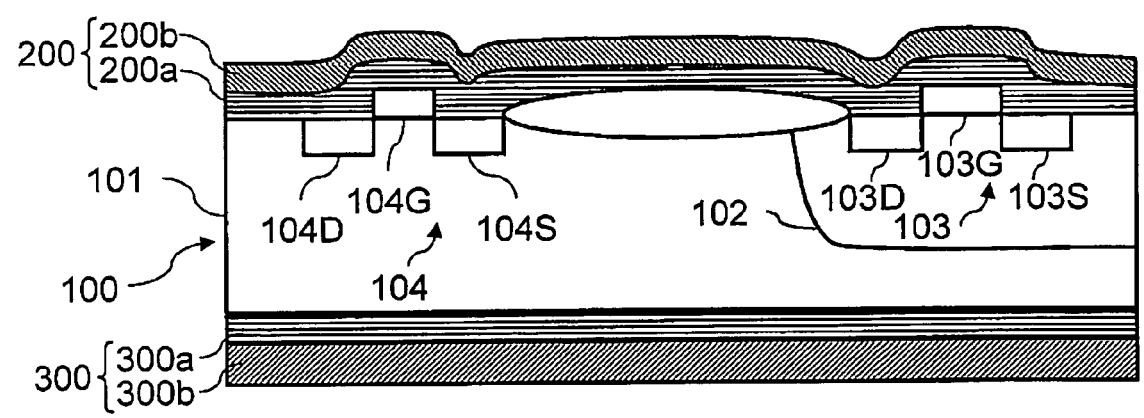

On the other side of the semiconductor device 100, i.e. the so-called back side, is formed with a second stress layer 300, as shown in FIG. 1C. The second stress layer 300 can have a single or many layers. The second stress layer 300 is then dry etched or wet etched, as shown in FIG. 1D. In this embodiment, the first stress layer 200 and the second stress layer 300 are coated in the same step. The second stress layer 300 includes but not limited to stacked layers of silicon nitride 300a and silicon dioxide 300b. The second stress layer 300 is not in direct contact with transistors. Therefore, an inorganic or organic thin film with higher stress can be used in another embodiment.

Figure 1E:
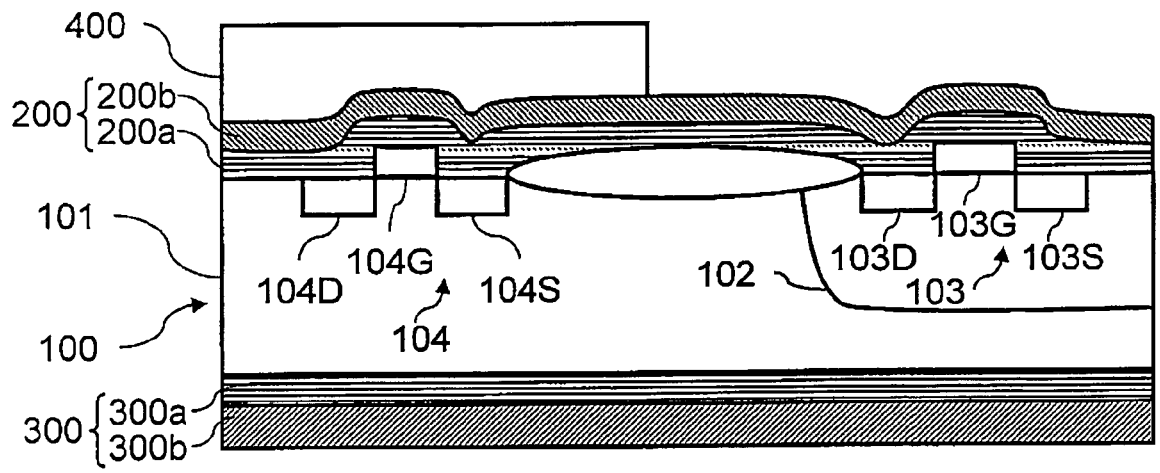
Figure 1F:
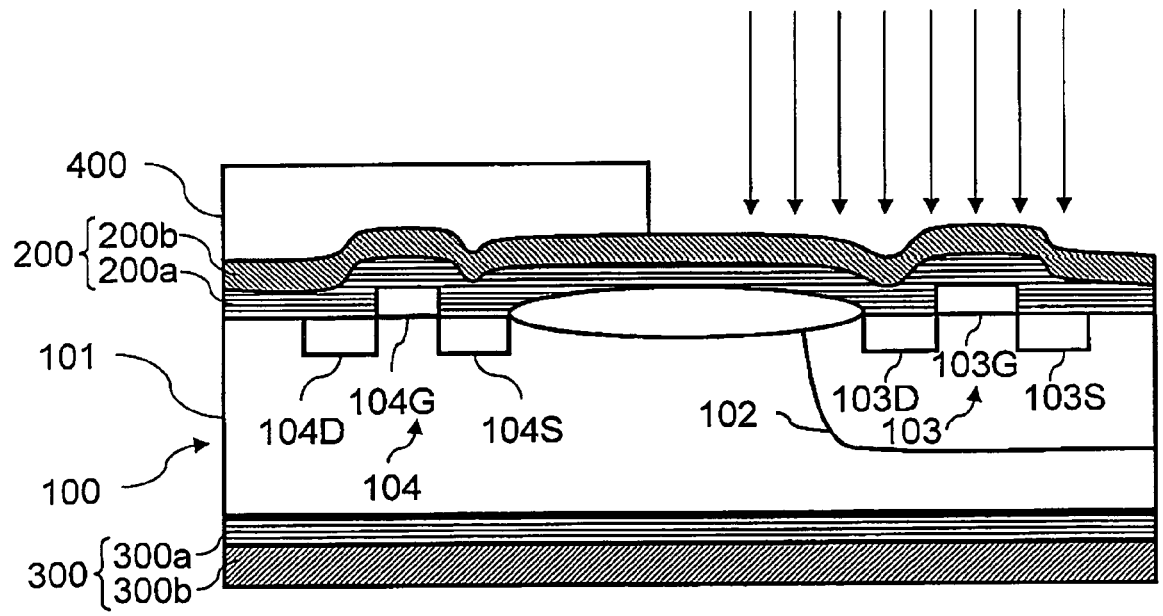

Afterwards, photo resist 400 is deposited on the first stress layer 200 to define a PMOS region so as to implant ions in the stress layer on the PMOS FET's, as shown in FIG. 1E. Finally, the part of the first stress layer 200 on the semiconductor device 100 that is not covered by the photo resist 400 is implanted with ions to change the stress type of the first stress layer 200, as shown in FIG. 1F. The ion implantation selects one or some combination of the elements P, As, Sb and the compound $BF_2$. The depth of ion implantation is between 5% and 90% of the thickness of the first stress layer 200.

Another embodiment of the disclosed method is given in FIG. 2. The early steps are the same or similar to those in FIGS. 1A to 1C. Therefore, we do not repeat their description here. We only highlight the different parts in FIGS. 2A to 2C.

Figure 2A:
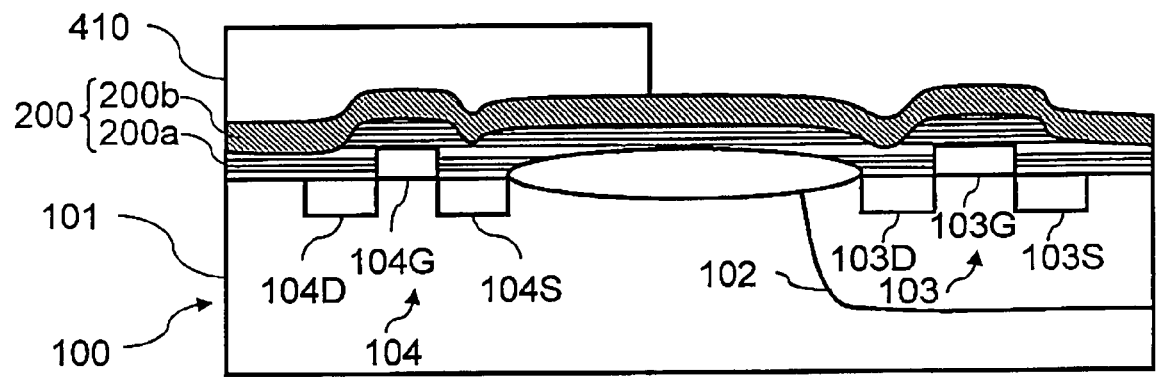
FIGS. 2A to 2D show another embodiment of the disclosed method of fabricating semiconductor devices.
Figure 2B:
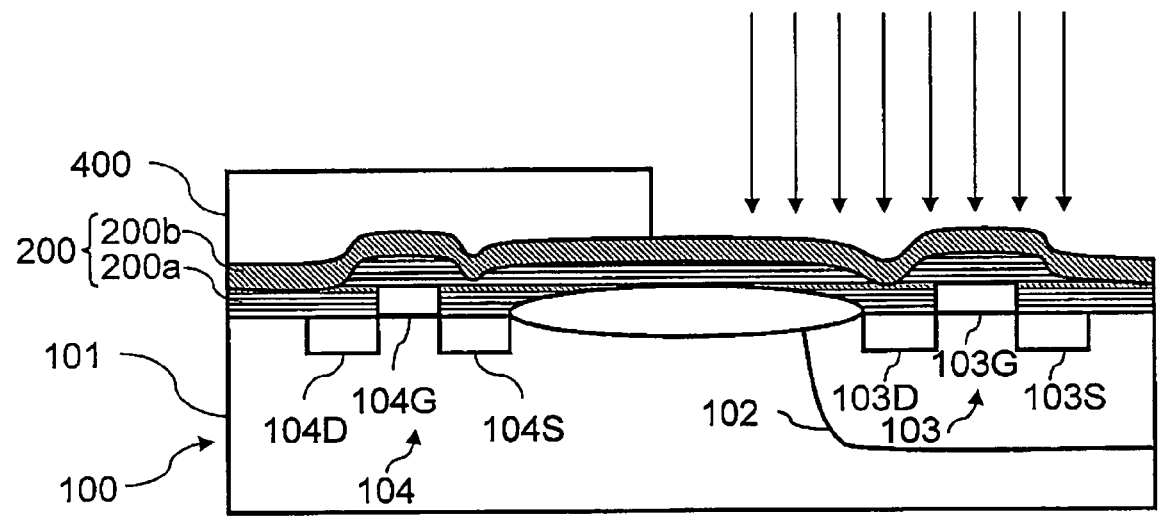

Photo resist 410 is first deposited on the first stress later 200 to define the PMOS region, as shown in FIG. 2A. Ion implantation is then performed for the first stress layer 200 on the semiconductor device 100 that is not covered by the photo resist 410 to change the stress type of the first stress layer 200, as shown in FIG. 2B.

Figure 2C:
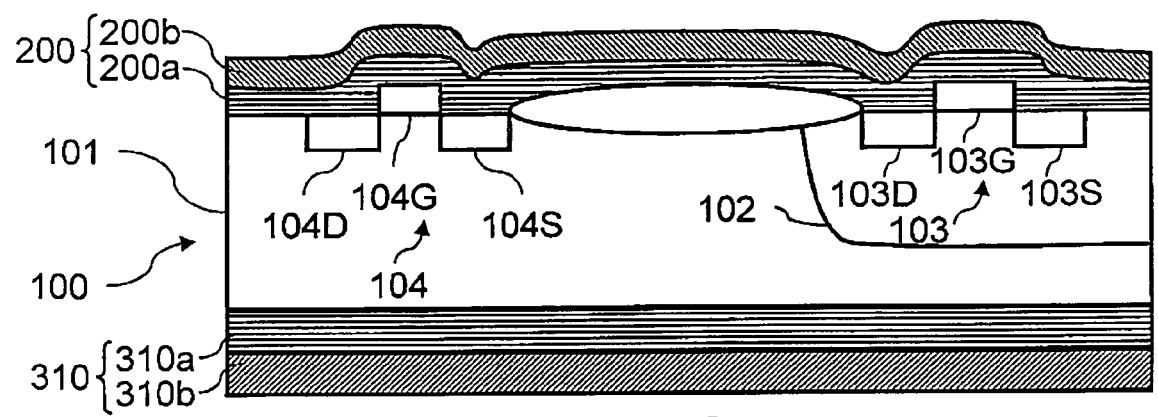
Figure 2D:
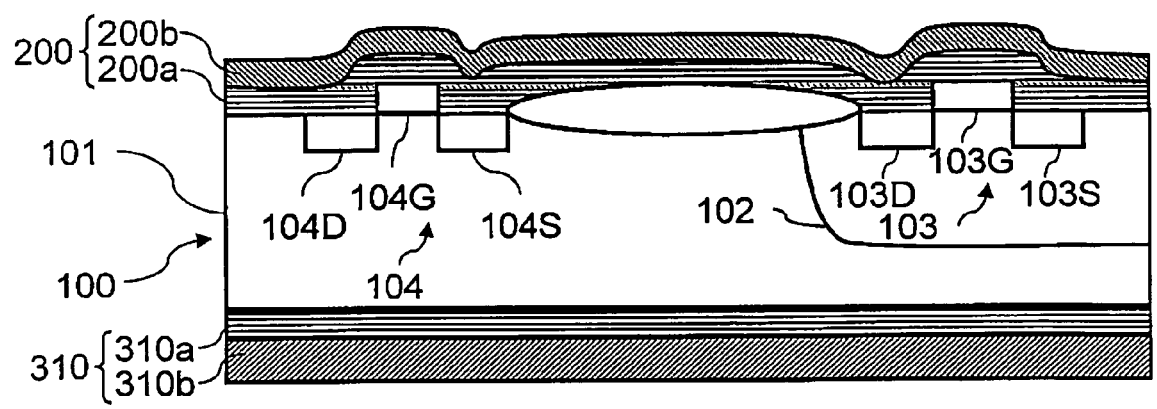

The other side of the semiconductor device 100 (i.e. the so-called back side) is formed with a second stress layer 310, as shown in FIG. 2C. The second stress layer 310 is then dry etched or wet etched, as shown in FIG. 2D. In this embodiment, the first stress layer 200 and the second stress layer 310 are formed in different steps.

In the above two embodiments, the thickness of the second stress layer 300, 310 can be adjusted to change the stress of the first stress layer 200. Along with a front ion implantation technique and photo resist, a substrate can be formed with regions of certain tensile and compressive stresses, thereby enhancing the performance of NMOS and PMOS devices. Therefore, the invention can solve the problem of difficult process integration due to different stress requirements in a CMOS FET.

On the other hand, when using silicon nitride and silicon dioxide layers as the second stress layer to generate a stress source, one may obtain etch-stop effects because of a fairly high selection ratio in dry etching. Therefore, one can readily adjust the thickness of the silicon nitride and silicon dioxide layers on the back of the substrate to modify the stress force on the front surface of the first stress layer 200. Along with the ion implantation technique, blocks with certain tensile and compressive stresses can be obtained on the front surface of the substrate. Since the mobility of electrons is much higher than holes, the nature modification of PMOS plays a relatively important role in CMOS. Therefore, for the stress modulation in the second stress layer on the back side, one can reserve a larger thickness so that a larger dragging force is generated on the substrate to increase the compressive stress in the high stress layer on the surface. One may also employ an extra process to coat a single or multiple layers with larger stress on the back side to impose a larger stress force on the substrate.

In comparison with the embodiment shown in FIGS. 1 and 2, the disclosed method can be used in a semiconductor device 100 that contains only one device, PMOS or NMOS. That is, we only need to change the stress for one device.

The invention uses the silicon nitride and silicon dioxide layers as the stress source, accompanied by a local ion implantation technique, to achieve nature modification of CMOS devices. We describe in the following paragraphs how to achieve different stresses in different regions of a high stress layer, thereby improving devices of different types. After ion implantation in the silicon nitride and silicon dioxide layers, atomic collisions result in many broken Si—N bonds in the films. Therefore, the silicon nitride and silicon dioxide layers above the chip are looser, thus releasing the stress therein. Those silicon nitride and silicon dioxide layers on the back side are not destroyed, still presenting a tensile stress. Under these two effects, the silicon nitride and silicon dioxide layers along with the chip are pulled downward. Finally, the silicon nitride and silicon dioxide layers implanted with ions experience a huge compressive stress.

The regions unprocessed by ion implantation on the silicon nitride and silicon dioxide layers have balanced stresses on the front and back surfaces of the chip. Therefore, only a small tensile stress appears in the front silicon nitride and silicon dioxide layers. The stress of the front silicon nitride and silicon dioxide layers can be modulated by controlling the thickness of backside stress films. However, if the silicon nitride and silicon dioxide layers on the back side are removed, then the silicon nitride and silicon dioxide layers on the front surface will have a large tensile stress.

The invention uses L2M30037.1 samples to experiment. The results are shown in Tables 1 and 2. Table 1 shows the stress variations on the silicon nitride film after a single ion implantation. Table 2 shows the stress variation on the silicon nitride film after double ion implantations.

TABLE 1

| Sample | Process | Implant depth (nm) | Before (MPa) | After (MPa) | Change |
|---|---|---|---|---|---|
| PECVD Si$_3$N$_4$ 50 nm | Ion implantation, 9500XR, P, 20 keV, 2E16 | 15.4 ± 6.5 | −263.5 | +3.8 | Δσ = +267.3 tensile |
| PECVD Si$_3$N$_4$ 100 nm | Ion implantation, 9500XR, As, 20 keV, 2E16 | 9.9 ± 3.3 | −390.3 | −239.9 | Δσ = +150.4 tensile |
| PECVD Si$_3$N$_4$ 100 nm | Ion implantation, 9500XR, BF2, 50 keV, 2E16 | 27.4 ± 8.3 | −382.5 | −80.2 | Δσ = +302.3 tensile |
| PECVD Si$_3$N$_4$ 150 nm | Ion implantation, 9500XR, Sb, 20 keV, 1E16 | 9 ± 2.4 | −346.6 | −310.9 | Δσ = +35.7 tensile |
| LPCVD Si$_3$N$_4$ 100 nm | Ion implantation, 9500XR, P, 40 keV, 2E16 | 30 ± 11.8 | +90.8 | −1015.4 | Δσ = −1106.2 compressive |
| LPCVD Si$_3$N$_4$ 100 nm | Ion implantation, 9500XR, As, 20 keV, 2E16 | 9.9 ± 3.3 | −90.3 | −626.6 | Δσ = −536.3 compressive |

TABLE 2

| Sample | Process | Implant Depth (nm) | Before (MPa) | First implant (MPa) | Second implant (MPa) |
|---|---|---|---|---|---|
| PECVD Si$_3$N$_4$ 50 nm | Ion implantation, P, 20 keV, 2E16 P, 30 keV, 5E15 | 22.6 ± 9.2 | −263.5 | +3.8 | −19.3 |
| PECVD Si$_3$N$_4$ 100 nm | Ion implantation, As, 20 keV, 2E16 As, 120 keV, 5E15 | 43.3 ± 13.7 | −390.3 | −239.9 | −48 |
| PECVD Si$_3$N$_4$ 100 nm | Ion implantation, BF2, 50 keV, 2E16 BF2, 80 keV, 2E16 | 43.2 ± 10.9 | −382.5 | −80.2 | −77.5 |
| LPCVD Si$_3$N$_4$ 100 nm | Ion implantation, P, 40 keV, 2E16 P, 60 keV, 6E15 | 45.3 ± 16.8 | +90.8 | −1015.4 | −1190.4 |
| LPCVD Si$_3$N$_4$ 100 nm | Ion implantation, As, 20 keV, 2E16 As, 120 keV, 5E15 | 43.3 ± 13.7 | −90.3 | −626.6 | −1335.3 |

From Tables 1 and 2, one can clearly see that ion implantation can greatly change the stress values in the silicon nitride films. The stress change also depends on the implantation depth in the silicon nitride film. Moreover, the ion implantation can change the stress type in a silicon nitride film, from a tensile stress to a compressive stress and vice versa.

Figure 3:
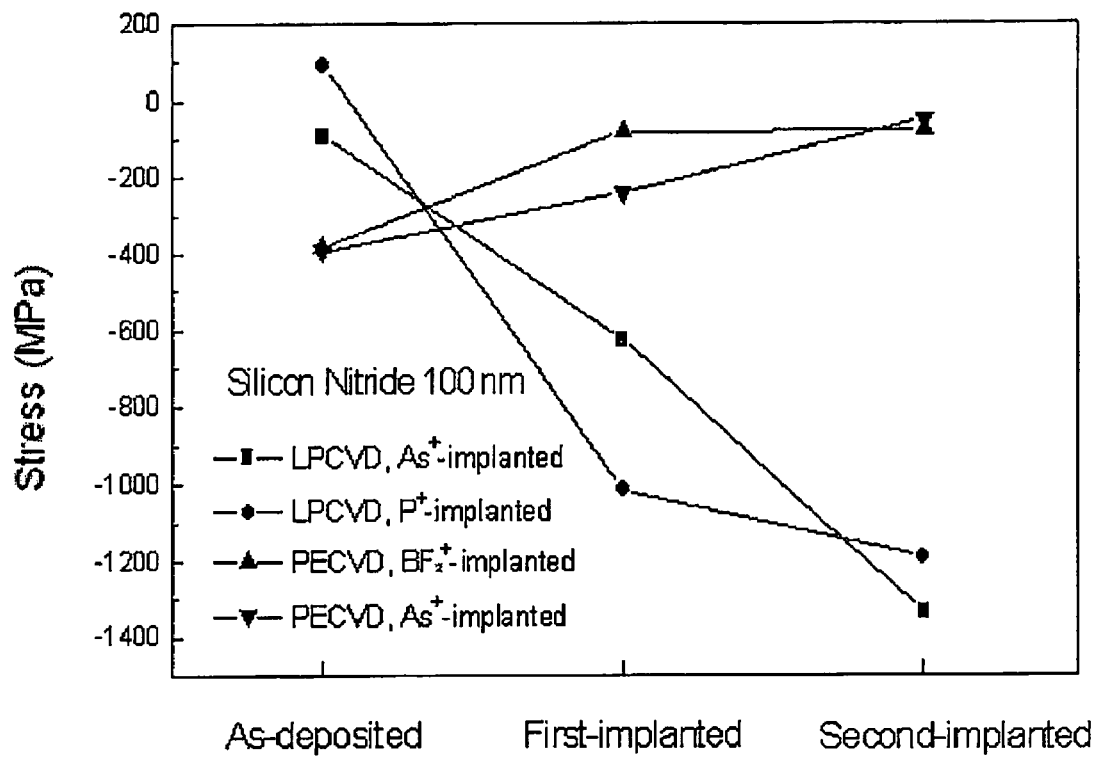
FIG. 3 illustrates that the stress on the PECVD or LPCVD silicon nitride film changes its direction after ion implantation.

Referring now to FIG. 3, after implanting ions into the samples formed by plasma enhanced chemical vapor deposition (PECVD) or low pressure chemical vapor deposition (LPCVD), the stress change direction on the silicon nitride film is opposite. The silicon nitride film grown in the PECVD system changes toward tensile stress direction, whereas the LPCVD samples changes toward compressive stress direction.

Figure 4:
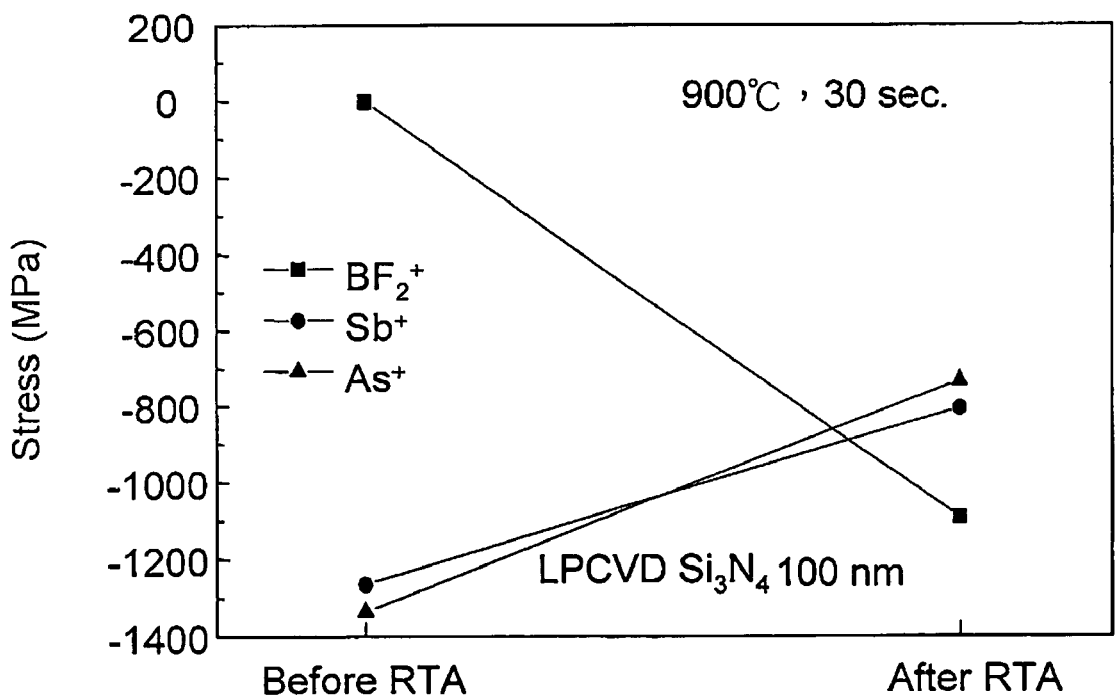
FIG. 4 shows the stress values of an ion-implanted silicon nitride film after rapid annealing.

We use FIG. 4 to illustrate that a fairly large stress is maintained after the silicon nitride film is annealed in an RTA system (900° C., 30 seconds). The compressive stress in the BF2+ implanted silicon nitride film is even enhanced after the rapid annealing. The improved device properties obtained by using the disclosed fabrication method are explained as follows.

Figure 5:
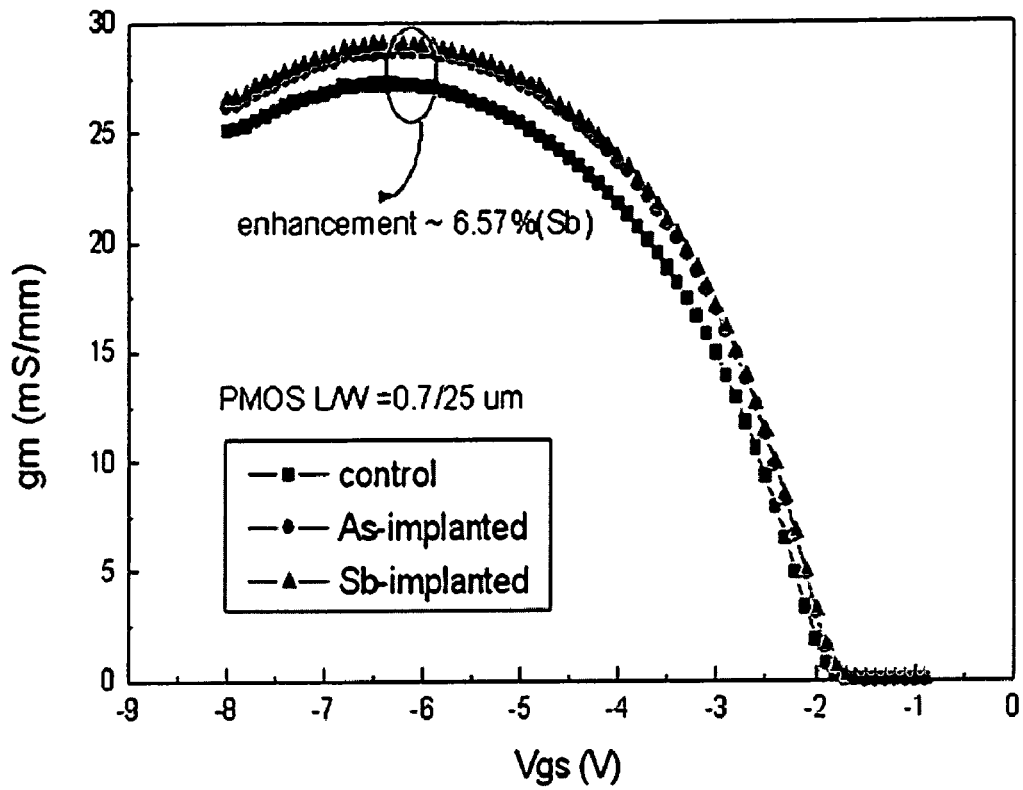
FIG. 5 shows the nature modification of a PMOS device manufactured using the disclosed method.

FIG. 5 shows the nature of PMOS devices. It is seen that the silicon nitride layer with ion implantation can effectively enhance its output properties.

Figure 6:
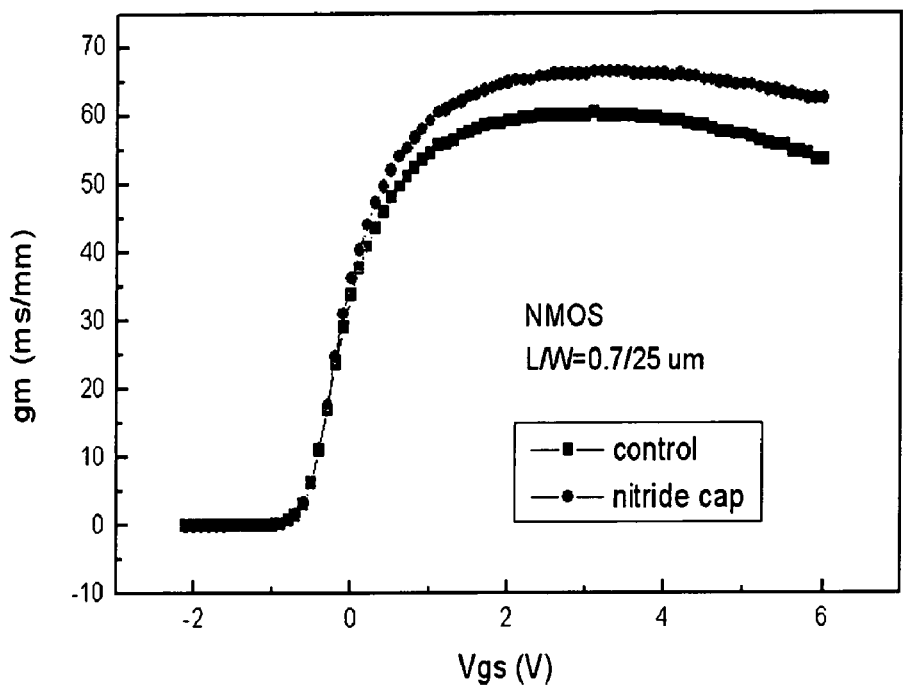
FIG. 6 shows the nature modification in the gain of a semiconductor device manufactured using the disclosed method.

FIG. 6 shows the gain of the semiconductor device finished using the disclosed method. It is seen that the gain of the NMOS device with a silicon nitride cap layer can be greatly enhanced.

Figure 7:
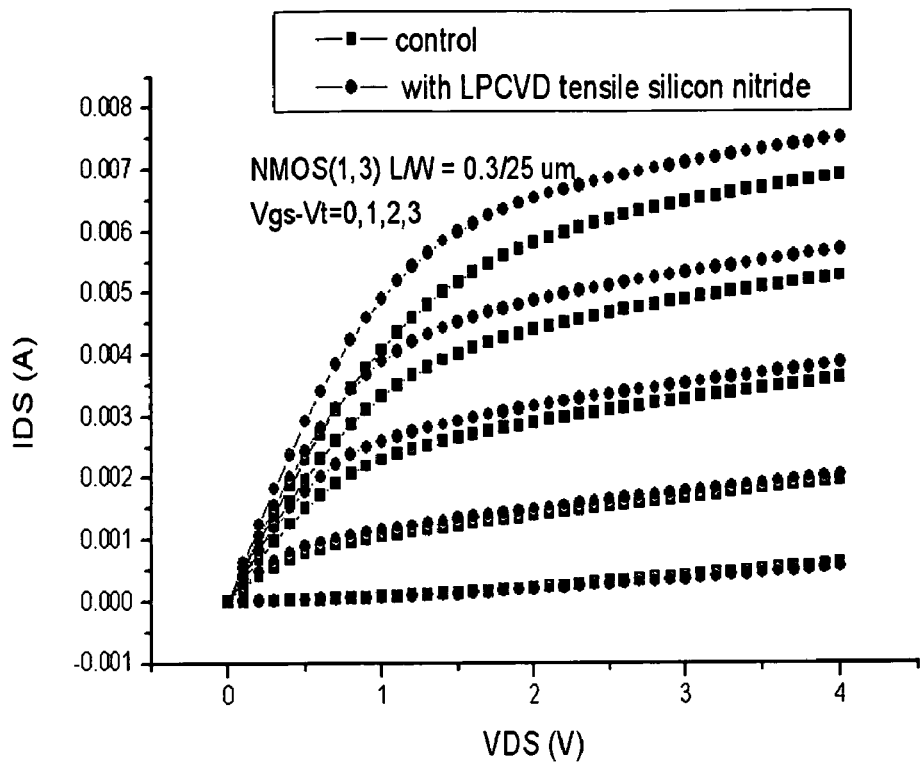
FIG. 7 shows the nature modification of an NMOS device manufactured using the disclosed method.

The nature modification of an NMOS device is shown in FIG. 7. The current of the NMOS with a silicon nitride cap layer is largely improved.

Figure 8:
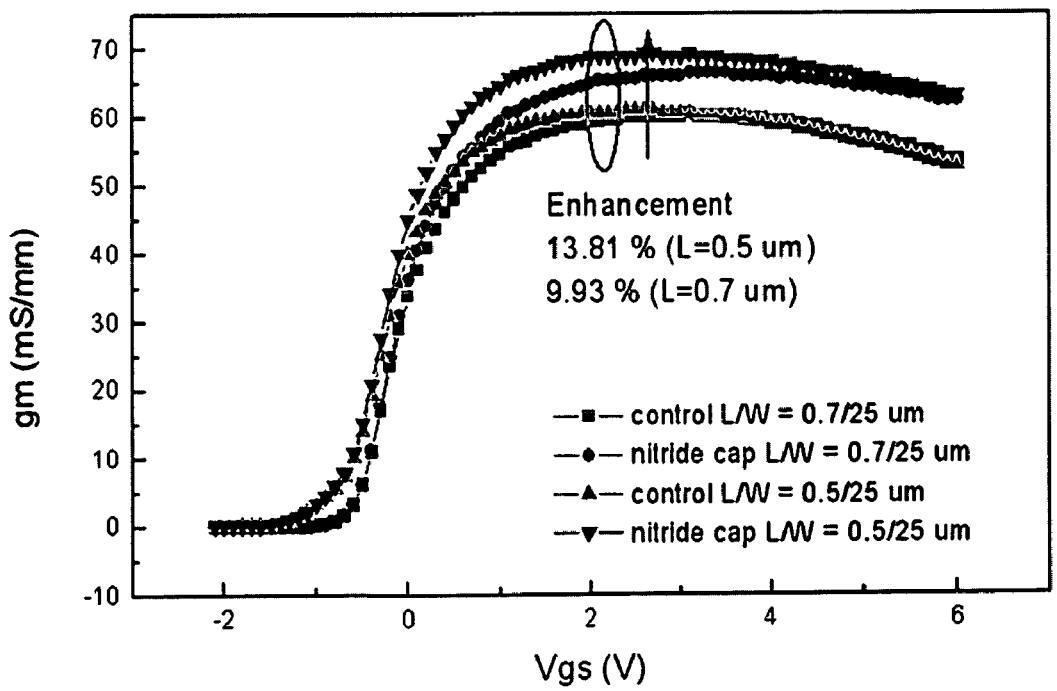
FIG. 8 shows the relation between the gain of an NMOS device with a silicon nitride cap layer and the gate length.

FIG. 8 shows the relation between the gain of an NMOS device with a silicon nitride cap layer and the gate length. It is seen that the gain increases as the gate length decreases.

The disclosed manufacturing method provides a process integration technique to improve the CMOS device properties. The invention uses back side stress engineering to change the stress values. The CMOS according to the disclosed method does not necessarily need the use of a silicide process. The silicon dioxide film can be undoped.

The disclosed manufacturing method allows the silicon nitride film to be directly stacked on the MOS device without first depositing a layer of oxide. With the deposition of silicon nitride and silicon dioxide layers, different regions can have tensile or compressive stresses by further employing ion implantation. This is completely different from the prior art, where film depositions depend on which type of MOS (PMOS or NMOS) one is considering.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a semiconductor device, comprising:
   providing a semiconductor device having a plurality of transistors;
   forming a plurality of first stress layers on a front side of the semiconductor device to cover the transistors, and forming a plurality of second stress layers on a back side of the semiconductor device in the same process, wherein a thickness of the second stress layers is adjustable so as to change a stress of the first stress layers;
   coating a photo resist over a region of the first stress layers to cover at least one of the transistors; and
   performing ion implantation on the part of the first stress layers uncovered by the photo resist, wherein the ion implantation has a depth between 5% and 90% of a thickness of the first stress layers, such that the first stress layers uncovered by the photo resist has a stress type that is different from the first stress layers covered by the photo resist.

2. The method of claim 1, wherein the semiconductor device has a plurality of P-type metal oxide semiconductor (PMOS) field effect transistors (FET) and a plurality of N-type metal oxide semiconductor (NMOS) field effect transistors (FET).

3. The method of claim 1, wherein the semiconductor device has a plurality of PMOS FET's.

4. The method of claim 1, wherein the semiconductor device has a plurality of NMOS FET's.

5. The method of claim 1, wherein the materials of the first and second stress layers are selected from the group consisting of BPSG, PSG, and BSG.

6. The method of claim 1, wherein the second stress layer is selected from the group consisting of organic and inorganic films.

7. The method of claim 1, wherein the first and second stress layers are formed using a method selected from plasma enhanced chemical vapor deposition (PECVD) and low pressure chemical vapor deposition (LPCVD).

8. The method of claim 1, wherein the ion in the step of performing ion implantation is selected from the group consisting of the elements P, As, Sb, the compound $BF_2$, and combination thereof.

9. The method of claim 1, further comprising a step of performing a rapid annealing process after performing the ion implantation.

10. A method of fabricating a semiconductor device, comprising:
    providing a semiconductor device having a plurality of transistors;
    forming a plurality of first stress layers on a front side of the semiconductor device to cover the transistors;
    coating a photo resist over a region on the first stress layers to cover at least one of the transistors;
    performing ion implantation on the part of the first stress layers uncovered by the photo resist, wherein the ion implantation has a depth between 5% and 90% of a thickness of the first stress layers, such that the first stress layers uncovered by the photo resist has a stress type that is different from the first stress layers covered by the photo resist; and
    forming a plurality of second stress layers on a back side of the semiconductor device after performing the ion implantation, wherein a thickness of the second stress layers is adjustable to change the stress of the first stress layers.

11. The method of claim 10, wherein the semiconductor device has a plurality of PMOS FET's and a plurality of NMOS FET's.

12. The method of claim 10, wherein the semiconductor device has a plurality of PMOS FET's.

13. The method of claim 10, wherein the semiconductor device has a plurality of NMOS FET's.

14. The method of claim 10, wherein the materials of the first and second stress layers are selected from the group consisting of BPSG, PSG, and BSG.

15. The method of claim 10, wherein the second stress layer is selected from the group consisting of organic and inorganic films.

16. The method of claim 10, wherein the first and second stress layers are formed using a method selected from PECVD and LPCVD.

17. The method of claim 10, wherein the ion in the step of performing ion implantation is selected from the group consisting of the elements P, As, Sb, the compound $BF_2$, and combination thereof.

18. The method of claim 10, further comprising a step of performing a rapid annealing process after performing the ion implantation.

* * * * *